United States Patent
Ramond et al.

(10) Patent No.: US 7,679,359 B2
(45) Date of Patent: Mar. 16, 2010

(54) APPLICATION-SPECIFIC INTEGRATED CIRCUIT WITH AUTOMATIC TIME-CONSTANT MATCHING

(75) Inventors: Alain Ramond, Merville (FR); Simon-Didier Venzal, Toulouse (FR); Michel Suquet, Villeneuve Tolosane (FR)

(73) Assignee: Continental Automotive France, Toulouse (FR)

( * ) Notice: Subject to any disclaimer, the term of this patent is extended or adjusted under 35 U.S.C. 154(b) by 219 days.

(21) Appl. No.: 11/935,421

(22) Filed: Nov. 6, 2007

(65) Prior Publication Data

US 2008/0297241 A1    Dec. 4, 2008

(30) Foreign Application Priority Data

Nov. 6, 2006 (FR) .................................. 06 09661

(51) Int. Cl.
*G01R 31/28* (2006.01)

(52) U.S. Cl. .................................................. 324/158.1
(58) Field of Classification Search ............. 324/158.1, 324/763–765
See application file for complete search history.

(56) References Cited

U.S. PATENT DOCUMENTS

| | | | | | |
|---|---|---|---|---|---|
| 5,625,288 | A | * | 4/1997 | Snyder et al. | 324/158.1 |
| 6,005,407 | A | * | 12/1999 | Arabi et al. | 324/765 |
| 6,944,810 | B2 | * | 9/2005 | Oberle et al. | 714/733 |
| 7,339,389 | B2 | * | 3/2008 | Mochizuki | 324/763 |

FOREIGN PATENT DOCUMENTS

| | | |
|---|---|---|
| EP | 1 326 336 A2 | 7/2003 |
| WO | 02/073801 A1 | 9/2002 |

OTHER PUBLICATIONS

Durham et al., "Circuit Architectures for High Linearity Monolithic Continuous-Time Filtering," IEEE Trans. on Circ. and Sys. II: Anal. and Dig. Sys. Proc., vol. 39, No. 9, pp. 651-657 (Sep. 1992).

* cited by examiner

*Primary Examiner*—Ha Tran T Nguyen
*Assistant Examiner*—Joshua Benitez
(74) *Attorney, Agent, or Firm*—Young & Thompson

(57) ABSTRACT

An application-specific integrated circuit includes a first analog stage having a first filtering means responsible for carrying out a filtering of the high-pass type on an input signal so as to deliver an intermediate signal, and a second digital stage having a second filtering means capable of introducing various first time constants depending on combinations of coefficient values and responsible for correcting any distortion potentially present in the intermediate signal, wherein the first filtering means includes an assembly of electronic components configured in parallel and/or in series and capable of introducing various second time constants depending on their combination.

14 Claims, 1 Drawing Sheet

APPLICATION-SPECIFIC INTEGRATED CIRCUIT WITH AUTOMATIC TIME-CONSTANT MATCHING

BACKGROUND OF THE INVENTION

1. Field of the Invention

The invention relates to the field of application-specific integrated circuits, or ASICs, and more particularly, to the control of the matching of time constants within such circuits.

2. Description of the Related Art

As is known by those skilled in the art, some application-specific integrated circuits (or ASICs) comprise a first analog stage coupled to a second digital stage.

The first stage notably comprises first (analog) filtering means responsible for carrying out filtering of the high-pass type on the input signal that they receive, so as to deliver an intermediate signal at the output. Since the first filtering means have a first cutoff frequency that is generally situated inside the bandwidth of the input signal, they induce a distortion of the intermediate signal delivered.

The second stage comprises second (digital) filtering means responsible for reducing as far as possible the distortion present in the intermediate signal delivered by the first stage. These second filtering means exhibit a second cutoff frequency that depends on the combination of filtering coefficient values that is used in their configuration.

For the reduction in distortion to be optimum, the first and second cutoff frequencies must be substantially equal. However, this is (very) difficult to achieve in practice.

In addition, the sampling frequency of the second filtering means, and therefore the operating frequency of the ASIC (defined using an oscillator), has a direct influence on the second cutoff frequency to the extent that each variation of the sampling frequency leads to a decrease in the efficiency of the processing of the distortion.

SUMMARY OF THE INVENTION

In order to avoid having a distortion, and therefore having to perform a matching between the cutoff frequencies (or between the associated time constants), one solution consists in using first filtering means having a first cutoff frequency outside of the bandwidth of the input signal.

The aim of the invention is to provide an alternative solution allowing the conventional architecture to be conserved that is based on a first analog stage, which cutoff frequency is within the range of the bandwidth of the input signal, and a second digital stage.

For this purpose, the invention provides an application-specific integrated circuit comprising a first analog stage comprising first filtering means responsible for carrying out a filtering of the high-pass type on an input signal so as to deliver an intermediate signal, and a second digital stage comprising second filtering means capable of introducing various first time constants depending on combinations of filtering coefficient values and responsible for correcting any distortion potentially present in the intermediate signal.

This application-specific integrated circuit is characterized in that:

its first filtering means comprise an assembly of electronic components configured in parallel and/or in series and designed to introduce various second time constants depending on their combination, and it comprises:

generation means responsible for supplying a test input signal, selection means coupled in series or in parallel to the electronic components of the assembly and responsible for setting up a chosen combination of electronic components of this assembly and a combination of coefficient values defined by at least one command, and processing means responsible for determining for the selection means at least one command allowing a virtual equality between a third chosen time constant and the first and second time constants to be induced.

The application-specific integrated circuit according to the invention can comprise other characteristics that may be taken separately or in combination, and notably:

its processing means can be responsible for i) comparing the second time constant, which is introduced by the combination set up (currently) of electronic components of the assembly, with the third chosen time constant and, when the second and third time constants differ, determining for the selection means a command allowing a new combination of electronic components of the assembly to be set up allowing a new second time constant to be introduced that is virtually equal to the third time constant, and ii) comparing the first time constant, which is introduced by the set up combination of coefficient values, with the third chosen time constant and, when the first and third time constants differ, determining for the selection means a command allowing a new combination of coefficient values to be set up allowing a new first time constant to be introduced that is virtually equal to the third chosen time constant.

as a variant, its processing means can be responsible for i) comparing the second time constant, which is introduced by the combination set up (currently) of electronic components of the assembly, with the third chosen time constant and, when the second and third time constants differ, determining for the selection means a command allowing a new combination of electronic components of the assembly to be set up allowing a new second time constant to be introduced that is virtually equal to the third chosen time constant, then ii) comparing the first time constant, which is introduced by the set up combination of coefficient values, with the new second (or with the third) time constant and, when the new second (or third) and first time constants differ, determining for the selection means a command allowing a new combination of coefficient values to be set up allowing a new first time constant to be introduced that is virtually equal to the new second (or third) time constant;

the assembly of electronic components can comprise a first subassembly of resistive components and a second subassembly of capacitive components, these first and second subassemblies being configured in parallel;

the first subassembly can comprise at least two resistive components configured in parallel and/or series;

the first subassembly can comprise resistive components that are identical to one another;

the second subassembly can comprise at least two capacitive components configured in parallel and/or series;

the second subassembly can comprise capacitive components that are identical to one another;

its selection means can comprise switches configured in series or in parallel with the electronic components of the assembly and responsible for controlling the access to all or part of the electronic components of this assembly, as a function of a command determined by the processing means.

Other features and advantages of the invention will become apparent upon examining the detailed description hereinafter, and the appended drawing, in which the sole FIGURE shows a very schematic functional illustration of a part of an exemplary embodiment of an application-specific integrated circuit (or ASIC) according to the invention. The appended drawing will not only be able to be used to complete the invention, but also to contribute to its definition, where necessary.

The object of the invention is to enable an application-specific integrated circuit (or ASIC) to match the time constants (and hence the cutoff frequencies) of its first analog stage and second digital stage.

In the following, by way of non-limiting example, it is considered that the application-specific integrated circuit (or ASIC) is intended to form part of a pressure sensor for an automobile pre-heating plug. However, the invention is not limited to this type of application. It does in fact relate to all the fields using narrow-band ASICs, and in particular to the automobile field.

DETAILED DESCRIPTION OF THE INVENTION

Figure 1:
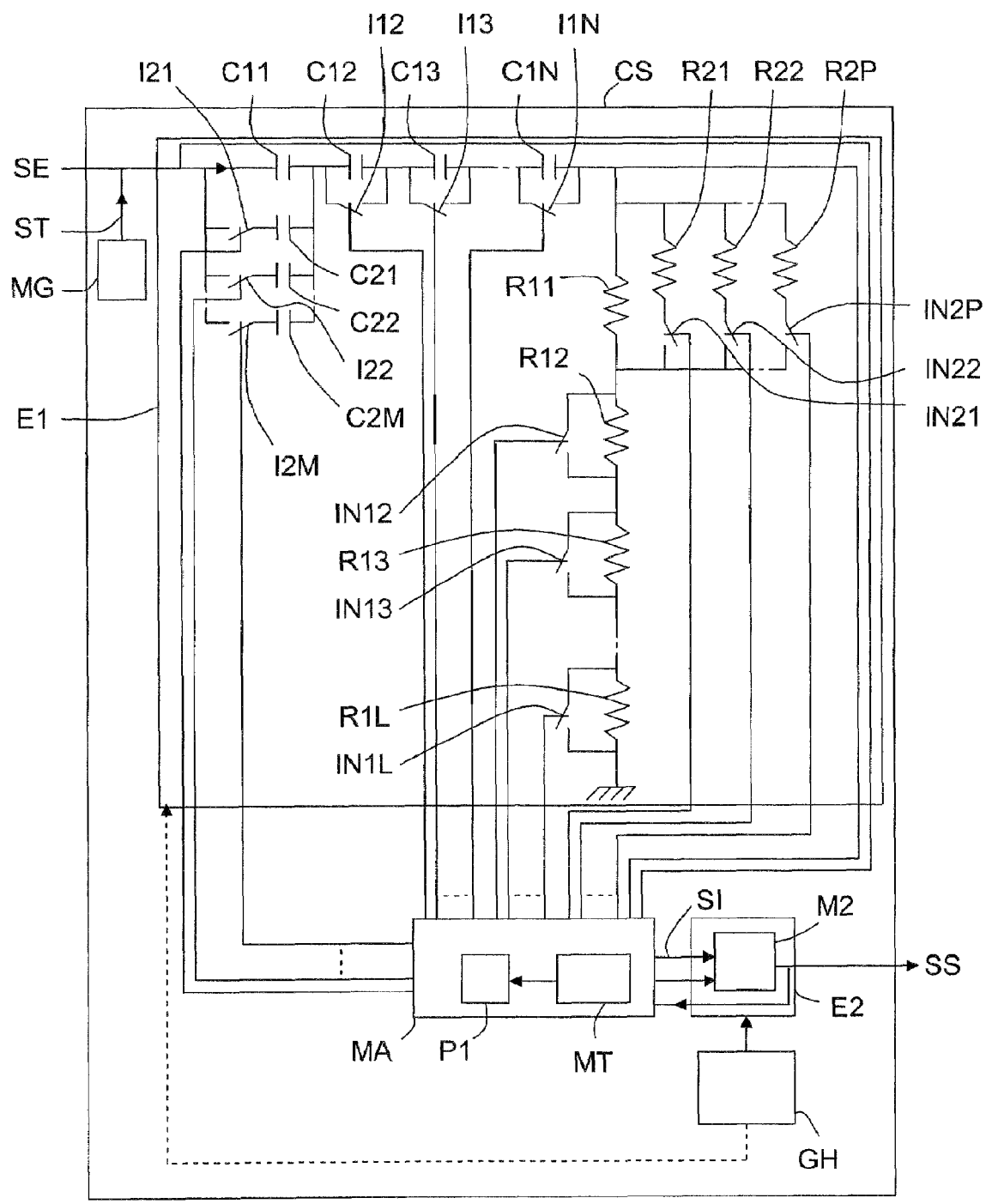
FIG. 1 is a schematic diagram of an application-specific integrated circuit.

As indicated hereinabove and as illustrated in FIG. 1, the invention relates to an application-specific integrated circuit CS comprising a first analog stage E1, a second digital stage E2, a digital oscillator GH, a module MG dedicated to the generation of a test input signal ST, a selection module P1, I1$n$, I2$m$, IN1$l$ and IN2$p$, and a processing module MT.

Here, "analog stage" is understood to mean a stage comprising electronic components (or integrated circuit(s)) essentially carrying out a signal processing function of the analog type. Furthermore, here "digital stage" is understood to mean a stage comprising electronic components (or integrated circuit(s)) essentially performing a signal processing function of the digital type.

The first stage E1 receives an input signal SE that it is responsible for filtering by means of a first filtering module so as to deliver at an output an intermediate (filtered) signal SI. This filtering is of the high-pass type. This first filtering module principally comprises an assembly of electronic components C1$n$ (n=1 to N), C2$m$ (m=1 to M), R1$l$ (l=1 to L) and R2$p$ (p=1 to P). N, M, L and P can take any given value greater than or equal to one depending on the needs of the application in question.

As will be seen hereinbelow, these electronic components C1$n$, C2$m$, R1$l$ and R2$p$ can be combined with one another in various ways so as to introduce various different (second) time constants CT2 and hence various different first cutoff frequencies Fc1, depending on their combination. These first cutoff frequencies Fc1 are included inside the bandwidth of the input signal SE to be filtered. For example (and in a non-limiting manner), this bandwidth is in the range from 0.1 Hz to 1 Hz.

The second digital stage E2 receives the intermediate signal SI that it is responsible for filtering by means of a second filtering module M2 in order to deliver at an output an output signal SS which distortion (introduced by the first filtering module of the first stage E1) is corrected so as to be as little as possible (and preferably virtually zero). Since this second filtering module M2 is of the digital type, the filtering that it performs depends on the set (or the combination) of filtering coefficient values that is chosen for its configuration. Several sets (or combinations) of values may be chosen in order to introduce various different (first) time constants CT1 and hence various different second cutoff frequencies Fc2.

The second stage E2, at least, receives digital clock signals from the digital oscillator GH. It is recalled that the sampling frequency of the second filtering module M2, and hence the operating frequency of the ASIC CS, are defined by these clock signals. Furthermore, as is indicated by the dashed line in the sole FIGURE, the digital oscillator GH can also supply the same digital clock signals to the first stage E1, and more precisely to its first filtering module, when certain of its electronic components require these.

The generation module MG is coupled to the input of the first stage E1 and is responsible for supplying it with a test input signal ST. The latter is for example a periodic square-pulse signal with characteristics (period and duration of pulses) that are precisely known, notably to the processing module MT.

The selection module P1, I1$n$, I2$m$, IN1$l$, IN2$p$ is coupled in series or in parallel with the electronic components C1$n$, C2$m$, R1$l$ and R2$p$ of the assembly and is responsible for setting up a chosen combination of electronic components from this assembly in the first stage E1 and a combination of coefficient values in the second filtering module M2, as a function of at least one command generated by the processing module MT.

The processing module MT is responsible for determining each command intended for the selection module P1. By definition, a command (or instruction) is a signal defining a chosen combination of electronic components C1$n$, C2$m$, R1$l$ and R2$p$ from the assembly and/or a combination of coefficient values apt to induce a virtual equality between a third chosen time constant CT3 (corresponding to a third cutoff frequency Fc3) and the first CT1 and second CT2 time constants (and hence the second Fc2 and first Fc1 cutoff frequencies, respectively).

"Virtual equality" is understood here to mean equality to within a small difference (typically ±0.1% to 3%).

In the presence of a bandwidth of the aforementioned type ([0.1 Hz-1 Hz]), the third cutoff frequency Fc3 is for example chosen to be equal to 0.5 Hz. It will be noted that the third cutoff frequency Fc3 is chosen as a function of the application in question for the application-specific circuit (or ASIC) CS and taking into account the consequences of filtering.

The determination of one or more commands can be made in at least two ways.

A first way consists in comparing the second time constant CT2 (corresponding to the first cutoff frequency Fc1), introduced by the first filtering module of the first stage E1, and the first time constant CT1 (corresponding to the second cutoff frequency Fc2), introduced by the second filtering module M2, with the third chosen time constant CT3, which corresponds to the third chosen cutoff frequency Fc3.

For this purpose, the processing module MT is coupled, on the one hand, to the output of the first filtering module of the first stage E1 in order to determine from the intermediate signal SI (resulting from the high-pass filtering of the test input signal ST) the second time constant CT2 that its selected combination of electronic components C1$n$, C2$m$, R1$l$ and R2$p$ has introduced and, on the other hand, to the output of the second filtering module M2 in order to determine from the output signal SS the first time constant CT1 that its combination of coefficient values has introduced.

These time constant determinations are made using the knowledge of the characteristics of the test input signal ST.

The processing module MT can thus compare, on the one hand, the second determined time constant CT2 with the third chosen time constant CT3 and, on the other hand, the first determined time constant CT1 with this same third chosen time constant CT3.

It will be noted that it is equivalent for the processing module MT to determine the first Fc1 and second Fc2 cutoff frequencies, then for it to compare them with the third cutoff frequency Fc3, since a cutoff frequency corresponds to a time constant.

When the result of a comparison indicates that the second CT2 and third CT3 time constants differ, the processing module MT determines a command (or a part of a command) allowing a new combination of electronic components C1$n$, C2$m$, R1$l$ and R2$p$ to be set up in the first filtering module of the first stage E1 allowing a new second time constant CT2', virtually equal to the third time constant CT3, to be introduced. Similarly, when the result of a comparison indicates that the first CT1 and third CT3 time constants differ, the processing module MT determines a command (or a part of a command) allowing a new combination of coefficient values to be set up in the second filtering module M2 allowing a new first time constant CT1', virtually equal to the third time constant CT3, to be introduced.

It will noted that the processing module MT may just as easily address the selection module P1 with a single command defining both a new combination of electronic components C1$n$, C2$m$, R1$l$ and R2$p$ and a new combination of coefficient values to be set up, as with a first command defining a new combination of electronic components C1$n$, C2$m$, R1$l$ and R2$p$ to be set up and a second command defining a new combination of coefficient values to be set up.

Furthermore, it will be noted that, following a double comparison, the processing module MT can address the selection module P1 with a command defining only a new combination of coefficient values to be set up. This case occurs when only the first time constant CT1 (or the second cutoff frequency Fc2) differs from the third time constant CT3 (or the third cutoff frequency Fc3). Similarly, it will be noted that, following a double comparison, the processing module MT can address the selection module P1 with a command defining only a new combination of electronic components C1$n$, C2$m$, R1$l$ and R2$p$ to be set up. This case occurs when only the second time constant CT2 (or the first cutoff frequency Fc1) differs from the third time constant CT3 (or the third cutoff frequency Fc3).

Upon receiving a command, the selection module P1 determines the corresponding operations necessary for setting up the new combination of electronic components C1$n$, C2$m$, R1$l$ and R2$p$ and/or the new set of coefficient values that it defines. Then it triggers these operations.

A second method consists in beginning by determining, by means of the processing module MT and starting from the intermediate signal SI (resulting from the high-pass filtering of the test input signal ST), the second time constant CT2 (corresponding to the first cutoff frequency Fc1), which is introduced by the first filtering module of the first stage E1.

Then, the processing module MT compares the second determined time constant CT2 with the third chosen time constant CT3 (corresponding to the third chosen cutoff frequency Fc3).

It will be noted that it is equivalent for the processing module MT to determine the first cutoff frequency Fc1, then for it to compare this with the third cutoff frequency Fc3.

If the result of the comparison indicates that the second CT2 and third CT3 time constants differ, the processing module MT determines a command allowing a new combination of electronic components C1$n$, C2$m$, R1$l$ and R2$p$ to be set up in the first filtering module of the first stage E1, which allows a new second time constant CT2', virtually equal to the third time constant CT3, to be introduced.

Upon receiving this command, the selection module P1 determines the corresponding operations necessary for the setting up of the new combination of electronic components C1$n$, C2$m$, R1$l$ and R2$p$. Then, it triggers these operations.

It will be noted that, if the result of the comparison indicates that the second CT2 and third CT3 time constants are virtually identical, the processing module MT does not need to determine a command for setting up a new combination of electronic components C1$n$, C2$m$, R1$l$ and R2$p$ in the first filtering module. Consequently, it carries out directly the second determination described hereinbelow.

The processing module MT subsequently determines, using the output signal SS (resulting from the filtering of the intermediate (test) signal SI obtained with the new combination of electronic components C1$n$, C2$m$, R1$l$ and R2$p$ set up by the selection module P1), the first time constant CT1 (corresponding to the second cutoff frequency Fc2), which is introduced by the second filtering module M2.

Then, the processing module MT compares the first determined time constant CT1 with the new chosen second time constant CT2' (corresponding to the new first cutoff frequency Fc1' virtually equal to Fc3) or else with the third time constant CT3 (which is equivalent).

It will be noted that it is equivalent for the processing module MT to determine the second cutoff frequency Fc2, then for it to compare this with the new first cutoff frequency Fc1' virtually equal to Fc3.

If the result of the comparison indicates that the first CT1 and third CT3 time constants differ, the processing module MT determines a command allowing a new set of coefficient values to be set up in the second filtering module M2 which allows a new first time constant CT1' to be introduced that is virtually equal to the new second time constant CT2' and hence to the third time constant CT3.

Upon receiving this command, the selection module P1 determines the corresponding operations necessary for setting up the new set of coefficient values. Then, it triggers these operations.

It will be noted that, where the result of the comparison indicates that the first CT1 and the new second CT2' (or third CT3) time constants are virtually identical, the processing module MT does not need to determine a command for setting up a new set of coefficient values in the second filtering module M2. Consequently, its action ends at this stage.

Several embodiments may be envisioned for the selection module P1 and for the first filtering module of the first stage E1.

In the example illustrated in FIG. 1, the first filtering module is referred to as "of the first order". Here, it is formed from an assembly of electronic components subdivided into a first subassembly of resistive components R1$l$ and R2$p$ and a second subassembly of capacitive components C1$n$ and C2$m$. These first and second subassemblies are connected in parallel.

The first subassembly preferably comprises at least two resistive components (for example resistors) that are configured in parallel and/or in series. More precisely, the first subassembly comprises a base resistor R1$l$ and at least one resistor R1$l$ (l=1 to L) connected in series with said base resistor R1$l$ and/or at least one resistor R2$p$ (p=1 to P) connected in parallel with said base resistor R1l. In the example illustrated, the first subassembly comprises both resistors R1l connected in series with the base resistor R1l and resistors R2p connected in parallel with this base resistor R1l, but this is not essential.

The resistive components R1l and/or R2p can be identical to one another or different from one another, depending on the requirements of the application considered.

The second subassembly preferably comprises at least two capacitive components (for example capacitors) which are configured in parallel and/or in series. More precisely, the second subassembly comprises a base capacitor C11 and at least one capacitor C1n (n=1 to N) connected in series with the base capacitor C11 and/or at least one capacitor C2m (m=1 to M) connected in parallel with the base capacitor C11. In the example illustrated, the second subassembly comprises both capacitors C1n connected in series with the base capacitor C11 and capacitors C2m connected in parallel with this base capacitor C11, but this is not essential.

The capacitive components C1n and/or C2m can be identical to one another or different from one another, according to the requirements of the application in question.

The electronic components R1l, R2p, C1n and C2m of the assembly are chosen in such a manner as to allow the introduction of various different second time constants CT2 depending on the combination that is selected by the selection module P1.

It will be noted that the assembly can potentially comprise additional electronic components such as, for example, a stray capacitor and/or an isolation resistor.

Furthermore, it will be noted that certain resistive components of the assembly can be switched-capacitance resistors which need clock signals delivered by the digital oscillator GH in order to operate.

In the example illustrated in FIG. 1, the selection module comprises two parts. The first part, referenced P1, receives the commands from the processing module MT and is responsible for transforming them into configuration instructions or commands. The second part (I1n, I2m, IN1l, IN2p) is arranged in the form of a switching module and receives a part of the configuration instructions generated by the first part P1.

The first part P1 therefore transmits configuration instructions, on the one hand, to the second filtering module M2 so as to send it the set of coefficient values to be set up and, on the other, to the switching module (I1n, I2m, IN1l, IN2p) in order to configure it so that it defines in the first filtering module of the first stage E1 a combination of electronic components C1n, C2m, R1l and R2p to be set up. It will be noted that this first part P1 may form an integral part of the processing module MT or may be external to the latter (as illustrated). In the example illustrated, the processing module MT and the first part P1 form part of the same analysis module MA, but this in not essential.

The switching module MC is for example composed of a set of switches I1n, I2m, IN1l and IN2p whose number varies as a function of the number of electronic components C1n, C2m, R1l and R2p. This set of switches is responsible for controlling the access to all or part of the electronic components C1n, C2m, R1l and R2p depending on the command determined by the processing module MT and transformed into a configuration instruction by the first part P1 of the selection module.

It will be noted that this switching module MC can form an integral part of the first stage E1 (or even of its first filtering module) as illustrated. However, it could also be external to the first stage E1.

In the example illustrated in FIG. 1, the capacitive components configured in parallel C2m are each accompanied by a switch I2m (m=1 to M) connected in series which, if closed, "activates" the corresponding capacitive component C2m (which results in the capacitive component C2m concerned being placed in parallel with the base capacitive component C11 and thus in the value of the total capacitance being increased and hence in the value of the second RC time constant CT2 being increased), and, if it is open, prohibits the associated capacitive component C2m from being taken into account by blocking the flow of the current. Again in this example illustrated, the capacitive components configured in series C1n are each accompanied by a switch I1n configured in parallel which, if open, "activates" the corresponding capacitive component C1n (which has the effect of placing the capacitive component C1n concerned in series with the base capacitive component C11 and of thus reducing the value of the total capacitance and hence of reducing the value of the second RC time constant CT2), and, if it is closed, prohibits the associated capacitive component C1n from being taken into account by short-circuiting it.

Again in this example illustrated, the resistive components configured in parallel R2p are each accompanied by a switch IN2p (p=1 to P) connected in series which, if it is closed, "activates" the corresponding resistive component R2p (which results in placing the resistive component R2p concerned in parallel with the base resistive component R1l and thus in decreasing the value of the total resistance and hence in decreasing the value of the second RC time constant CT2), and, if it is open, prohibits the associated resistive component R2p from being taken into account by blocking the flow of the current. Lastly, in this example illustrated, the resistive components configured in series R1l are each accompanied by a switch IN1l (l=1 to L) configured in parallel which, if it is open, 'activates' the corresponding resistive component R1l (which has the effect of placing the resistive component R1l concerned in series with the base resistive component R1l and of thus increasing the value of the total resistance and hence of increasing the value of the second RC time constant CT2), and, if it is closed, prohibits the associated resistive component R1l from being taken into account by short-circuiting it.

It is thus possible to define with a very high precision many different values of second time constant CT2, and hence of first cutoff frequency Fc1. As the values of the filtering coefficients can also be defined with a high precision, it is therefore now possible, thanks to the invention, to automatically control the matching between the time constants of the first E1 and second E2 stages, and hence to optimize the correction of the distortion introduced by the first filtering module of the first stage E1.

It goes without saying that numerous other examples of electronic components (of the assembly of the first filtering module) may be envisioned so as to allow different values of second time constant CT2 to be defined.

The processing module MT and the first part P1 of the selection module of the application-specific integrated circuit CS according to the invention preferably take the form of electronic circuits. However, they may also be in the form of software (or data processing) modules, or of a combination of circuits and software.

The invention is not limited to the application-specific integrated circuit (or ASIC) embodiments described hereinabove, solely by way of example, but it encompasses all the variants that could be envisioned by those skilled in the art.

What is claimed is:

1. An application-specific integrated circuit, comprising:
a first analog stage having a first filtering means capable of carrying out a filtering of the high-pass type on an input signal so as to deliver an intermediate signal, and a second digital stage having a second filtering means capable of introducing various first time constants depending on combinations of filtering coefficient values and arranged so as to correct any distortion potentially present in said intermediate signal, such that said first filtering means includes an assembly of electronic components capable of introducing various second time constants depending on their combination;
generation means designed to supply a test input signal;
selection means coupled to said electronic components and designed to set up a chosen combination of electronic components of said assembly and a combination of coefficient values defined by at least one command; and
processing means configured for determining for said selection means at least one command capable of inducing a virtual equality between a third chosen time constant and said first and second time constants.

2. The circuit as claimed in claim 1, wherein said processing means is configured for:
comparing said second time constant, introduced by the combination set up of electronic components of said assembly, with said third chosen time constant and, in the case of a difference between said second and third time constants, for determining for said selection means a command allowing a new combination of electronic components of said assembly to be set up that is capable of introducing a new second time constant virtually equal to said third time constant, and
comparing said first time constant, introduced by the set up combination of coefficient values, with said third chosen time constant and, in the case of a difference between said first and third time constants, for determining for said selection means a command allowing a new combination of coefficient values to be set up that is capable of introducing a new first time constant virtually equal to said third chosen time constant.

3. The circuit as claimed in claim 2, wherein said assembly of electronic components comprises a first subassembly of resistive components and a second subassembly of capacitive components, said first and second subassemblies being configured in parallel.

4. The circuit as claimed in claim 2, wherein said selection means comprise switches (I1n, I2m, IN1l, IN2p) configured with said electronic components and designed to control the access to all or part of the electronic components of the assembly as a function of a command determined by said processing means.

5. The circuit as claimed in claim 1, wherein said processing means is configured for:
comparing said second time constant, introduced by the combination set up of electronic components of said assembly, with said third chosen time constant and, in the case of a difference between said second and third time constants, for determining for said selection means a command allowing a new combination of electronic components of said assembly to be set up that is capable of introducing a new second time constant virtually equal to said third chosen time constant, then
comparing said first time constant, introduced by the set up combination of coefficient values, with said new second time constant and, in the case of a difference between said new second time constant and said first time constant, for determining for said selection means a command allowing a new combination of coefficient values to be set up that is capable of introducing a new first time constant virtually equal to said new second time constant.

6. The circuit as claimed in claim 1, wherein said processing means is configured for:
comparing said second time constant, introduced by the combination set up of electronic components of said assembly, with said third chosen time constant and, in the case of a difference between said second and third time constants, for determining for said selection means a command allowing a new combination of electronic components of said assembly to be set up that is capable of introducing a new second time constant virtually equal to said third chosen time constant, then
comparing said first time constant, introduced by the set up combination of coefficient values, with said third chosen time constant and, in the case of a difference between said first and third time constants, for determining for said selection means a command allowing a new combination of coefficient values to be set up that is capable of introducing a new first time constant virtually equal to said third time constant.

7. The circuit as claimed in claim 1, wherein said assembly of electronic components comprises a first subassembly of resistive components (R1l, R2p) and a second subassembly of capacitive components, said first and second subassemblies being configured in parallel.

8. The circuit as claimed in claim 7, wherein said first subassembly comprises at least two resistive components.

9. The circuit as claimed in claim 8, wherein said first subassembly comprises resistive components that are identical to one another.

10. The circuit as claimed in claim 8, wherein said second subassembly comprises at least two capacitive components.

11. The circuit as claimed in claim 9, wherein said second subassembly comprises at least two capacitive components.

12. The circuit as claimed in claim 7, wherein said second subassembly comprises at least two capacitive components.

13. The circuit as claimed in claim 12, wherein said second subassembly comprises capacitive components that are identical to one another.

14. The circuit as claimed in claim 1, wherein said selection means comprise switches configured with said electronic components and designed to control the access to all or part of the electronic components of the assembly as a function of a command determined by said processing means.

* * * * *